US012300523B2

(12) United States Patent
Kilpi

(10) Patent No.: US 12,300,523 B2
(45) Date of Patent: May 13, 2025

(54) SUBSTRATE PROCESSING APPARATUS AND METHOD

(71) Applicant: Picosun Oy, Espoo (FI)

(72) Inventor: Väinö Kilpi, Masala (FI)

(73) Assignee: Picosun Oy, Espoo (FI)

( * ) Notice: Subject to any disclaimer, the term of this patent is extended or adjusted under 35 U.S.C. 154(b) by 202 days.

(21) Appl. No.: 17/790,386

(22) PCT Filed: Dec. 21, 2020

(86) PCT No.: PCT/FI2020/050861
§ 371 (c)(1),
(2) Date: Jun. 30, 2022

(87) PCT Pub. No.: WO2021/140270
PCT Pub. Date: Jul. 15, 2021

(65) Prior Publication Data
US 2023/0067579 A1    Mar. 2, 2023

(30) Foreign Application Priority Data

Jan. 10, 2020   (FI) ..................................... 20205023

(51) Int. Cl.
*H01J 37/32*     (2006.01)
*C23C 16/455*    (2006.01)
(Continued)

(52) U.S. Cl.
CPC .. *H01L 21/67178* (2013.01); *C23C 16/45536* (2013.01); *C23C 16/45544* (2013.01);
(Continued)

(58) Field of Classification Search
CPC ......... H01L 21/67178; H01L 21/67126; H01L 21/67103; H01L 21/02274;
(Continued)

(56) References Cited

U.S. PATENT DOCUMENTS 5,110,407 A * 5/1992 Ono .................... H01L 21/3085
118/620
5,772,770 A * 6/1998 Suda ................... C23C 16/4401
118/725

(Continued)

FOREIGN PATENT DOCUMENTS

CN    1342213 A    3/2002
CN    1791972 A    6/2006
(Continued)

OTHER PUBLICATIONS

MatWeb.com graphite properties.*
(Continued)

*Primary Examiner* — Rudy Zervigon
(74) *Attorney, Agent, or Firm* — Espatent Oy

(57) ABSTRACT

A substrate processing apparatus includes an inner chamber formed by an upper portion and a lower portion, a substrate support to support a substrate within the upper portion of the inner chamber, a plasma system to provide the inner chamber with plasma species from the top side of the inner chamber, and an outer chamber surrounding the upper portion of the inner chamber. The lower portion of the inner chamber extends to the outside of the outer chamber and remains uncovered by the outer chamber.

13 Claims, 7 Drawing Sheets

(51) Int. Cl.
  *C23C 16/511* (2006.01)
  *H01L 21/67* (2006.01)
(52) U.S. Cl.
  CPC ...... *C23C 16/511* (2013.01); *H01J 37/32357* (2013.01); *H01L 21/67126* (2013.01); *H01L 21/67103* (2013.01)
(58) Field of Classification Search
  CPC ............. H01L 21/67011; H01L 21/683; H01L 21/6719; H01L 21/67196; H01L 21/67201; H01L 21/67173; H01L 21/67184; H01L 21/6776; H01L 21/67161; H01L 21/67155; H01L 21/67017; H01L 21/67069; H01L 21/67748; H01L 21/67751; H01L 21/67745; C23C 16/45536; C23C 16/45544; C23C 16/511; C23C 14/00; C23C 16/452; C23C 16/45561; C23C 16/4583; C23C 16/4584; C23C 16/46; C23C 16/45525; C23C 16/4401; C23C 16/4581; C23C 16/50; C23C 16/54; C23C 16/458; C23C 16/4409; C23C 16/45551; C23C 16/545; C23C 16/4412; C23C 14/568; C23C 16/507; C23C 16/455; C23C 16/45591; H01J 37/32357; H01J 37/32192; H01J 37/32458; H01J 37/32522; H01J 37/32596; H01J 37/32807; H01J 37/32899; H01J 37/321; H01J 37/32082; H01J 37/3244; H01J 37/32174
  USPC ....... 118/723 I, 723 IR, 723 E, 723 ER, 719; 156/345.43, 345.44, 345.45, 345.46, 156/345.47, 345.31, 345.32, 345.48, 156/345.49
  See application file for complete search history.

(56) References Cited

U.S. PATENT DOCUMENTS

| | | | |
|---|---|---|---|
| 6,209,480 B1 | 4/2001 | Moslehi | |
| 6,383,896 B1 * | 5/2002 | Kirimura | C23C 16/45565 438/659 |
| 6,829,056 B1 | 12/2004 | Barnes et al. | |
| 7,210,424 B2 | 5/2007 | Tolmachev et al. | |
| 7,361,387 B2 | 4/2008 | Nguyen | |
| 7,576,012 B2 | 8/2009 | Doan et al. | |
| 8,039,772 B2 | 10/2011 | Lee et al. | |
| 8,440,268 B2 | 5/2013 | Washio et al. | |
| 8,545,764 B2 | 10/2013 | Gesche | |
| 8,741,062 B2 | 6/2014 | Lindfors et al. | |
| 8,883,269 B2 | 11/2014 | Won et al. | |
| 8,980,049 B2 | 3/2015 | Lee et al. | |
| 9,006,972 B2 | 4/2015 | Hopwood | |
| 9,111,728 B2 * | 8/2015 | Holland | H01J 37/32357 |
| 9,165,771 B2 | 10/2015 | Ventzek et al. | |
| 9,518,322 B2 | 12/2016 | Ito et al. | |
| 9,653,865 B2 | 5/2017 | Ayabakan et al. | |
| 9,869,022 B2 | 1/2018 | Sawada | |
| 10,431,427 B2 | 10/2019 | Liang et al. | |
| 10,494,719 B2 | 12/2019 | Asmussen et al. | |
| 10,685,813 B2 | 6/2020 | Mai | |
| 2001/0011526 A1 | 8/2001 | Doering et al. | |
| 2004/0231799 A1 * | 11/2004 | Lee | C23C 16/50 156/345.34 |
| 2005/0066902 A1 | 3/2005 | Fink | |
| 2007/0137572 A1 | 6/2007 | Matsuura et al. | |
| 2007/0186857 A1 | 8/2007 | Kim et al. | |
| 2007/0281083 A1 | 12/2007 | Lakshmanan et al. | |
| 2009/0277587 A1 | 11/2009 | Lubomirsky et al. | |
| 2011/0039355 A1 | 2/2011 | Zhao et al. | |
| 2011/0265721 A1 | 11/2011 | Kao et al. | |
| 2011/0315560 A1 | 12/2011 | Rabaey et al. | |
| 2013/0105085 A1 | 5/2013 | Yousif et al. | |
| 2016/0068961 A1 * | 3/2016 | Liu | C23C 16/455 118/697 |
| 2017/0229290 A1 * | 8/2017 | Kobayashi | H01L 21/6719 |
| 2018/0315626 A1 | 11/2018 | Franklin | |
| 2019/0066983 A1 | 2/2019 | Sung et al. | |
| 2019/0119815 A1 | 4/2019 | Park et al. | |
| 2019/0390339 A1 | 12/2019 | Malinen | |

FOREIGN PATENT DOCUMENTS

| | | |
|---|---|---|
| CN | 107306473 A | 10/2017 |
| CN | 110234793 A | 9/2019 |
| EP | 2159819 B1 | 8/2018 |
| EP | 3309815 B1 | 3/2019 |
| GB | 2426252 A | 11/2006 |
| JP | S57156194 U | 10/1982 |
| JP | H065520 A | 1/1994 |
| JP | H02110951 U | 9/1995 |
| JP | 2002101664 A | 4/2002 |
| JP | 2012512326 A | 5/2012 |
| KR | 101283571 B1 | 7/2013 |
| TW | 201200626 A | 1/2012 |
| TW | 201839164 A | 11/2018 |
| WO | 2011163455 A2 | 12/2011 |
| WO | 2012136875 A1 | 10/2012 |

OTHER PUBLICATIONS

Finnish Patent and Registration Office, Office Action, U.S. Appl. No. 20/225,231, Mailed Oct. 13, 2022, 1 page.
Finnish Patent and Registration Office, Search Report, U.S. Appl. No. 20/225,231, Mailed Oct. 13, 2022, 2 pages.
Finnish Patent and Registration Office, Search Report, U.S. Appl. No. 20/205,023, Mailed Apr. 2, 2020, 2 pages.
Notification of Transmittal of The International Search Report and The Written Opinion of The International Searching Authority, or The Declaration, Application No. PCT/FI2020/050861, Mailed May 21, 2021, 17 pages.
Taiwan Patent Office, Search Report, Application No. 109143699, Mailed Jul. 30, 2021, 1 page.
United States Patent and Trademark Office, Advisory Action, U.S. Appl. No. 16/749,052, Mailed Nov. 9, 2020, 2 pages.
United States Patent and Trademark Office, Final Office Action, U.S. Appl. No. 16/749,052, Mailed Jun. 29, 2020, 17 pages.
Finnish Patent and Registration Office, Office Action, U.S. Appl. No. 20/205,023, Mailed Sep. 17, 2020, 1 page.
United States Patent and Trademark Office, Non-Final Office Action, U.S. Appl. No. 16/749,052, Mailed Mar. 2, 2020, 2 pages.
Chinese Patent Office, Notice of Second Office Action, Application No. 202010084878.3, Mailed Mar. 15, 2023, 9 pages, English Translation 21 pages.
Aiguo "Low Temperature Plasma Surface Strengthening Technologies" Published by Harbin Institute of Technology, ISBN 978-7-5603-4434-8, 2015, 4 Pages, English Translation 4 pages.
The State Intellectual Property Office of People's Republic of China, First Office Action, Application No. 202010084878.3, mailed Oct. 21, 2022, 12 pages, English Translation 12 pages.
The State Intellectual Property Office of People's Republic of China, Search Report, Application No. 202010084878.3 mailed Oct. 21, 2022, 4 pages.
China Patent Office, Office Action, Application No. 202010084878.3 mailed Feb. 22, 2024, 10 pages.
China Patent Office, Search Report, Application No. 202010084878. 3, Feb. 20, 2024, 3 pages.
Taiwan Patent Office, Office Action, Application No. 109143699, mailed Feb. 15, 2024, 11 pages.
Taiwan Patent Office, Search Report, Application No. 109143699, mailed Feb. 15, 2024, 1 page.

(56) References Cited

OTHER PUBLICATIONS

Japan Patent Office, Notification of Ground of Rejection, Application No. 2020-558477, Mailed Sep. 8, 2022, 2 pages.

* cited by examiner

SUBSTRATE PROCESSING APPARATUS AND METHOD

CROSS-REFERENCE TO RELATED APPLICATIONS

This application is related to U.S. patent application Ser. No. 16/749,052, filed on 22 Jan. 2020, now U.S. Pat. No. 11,004,707, issued on 11 May 2021, which claims priority to and the benefit of Finnish Patent Application No. FI 20205023, filed on 19 Jan. 2020.

FIELD OF THE INVENTION

The present invention generally relates to substrate processing methods and apparatus. More particularly, but not exclusively, the invention relates to plasma-enhanced atomic layer deposition (ALD) reactors.

BACKGROUND OF THE INVENTION

This section illustrates useful background information without admission of any technique described herein representative of the state of the art.

In chemical deposition methods, such as atomic layer deposition (ALD), plasma can be used to provide required additional energy for surface reactions. While ALD reactors have existed since many decades ago, plasma-enhanced reactors represent a younger technology. There is an ongoing need to develop improved plasma-enhanced ALD reactors or at least to provide alternatives to existing solutions.

SUMMARY

It is an object of certain embodiments of the invention to provide an improved substrate processing apparatus or at least to provide an alternative solution to existing technology.

According to a first example aspect of the invention there is provided a substrate processing apparatus, comprising:
- an inner chamber formed by an upper portion and a lower portion;
- a substrate support to support a substrate within the upper portion of the inner chamber;
- a plasma system to provide the inner chamber with plasma species from the top side of the inner chamber; and
- an outer chamber surrounding the upper portion of the inner chamber whereas the lower portion of the inner chamber extends to the outside of the outer chamber and remains uncovered by the outer chamber.

In certain embodiments, the apparatus comprises:
a heater in the outer chamber to heat the upper portion of the inner chamber.

In certain embodiments, the apparatus comprises:
heat reflectors in the outer chamber.

In certain embodiments, the apparatus comprises heat reflectors in between the heater and outer chamber wall or walls.

In certain embodiments, the plasma system is configured to provide the inner chamber with two different plasma species entering the inner chamber from the top side of the inner chamber or via a top part of the upper portion of the inner chamber. In certain embodiments, the plasma system is configured to provide the inner chamber with two different plasma species, wherein a first plasma species is generated in the upper portion of the inner chamber and a second plasma species is generated remotely. In certain embodiments, the remotely generated plasma species is fed via an in-feed line into the upper portion of the inner chamber, preferably via a reaction chamber top part.

In certain embodiments, the apparatus comprises:
a movable lid or a lid system (on the top side of the inner and/or outer chamber).

In certain embodiments, the lid or lid system forms a lid of the outer chamber. In certain embodiments, the inner chamber has a separate lid. In certain embodiments, the separate lid of the inner chamber is omitted and the lid system or outer chamber lid functions as a lid for both the outer and inner chamber.

Accordingly, in certain embodiments, the lid system (or outer chamber lid) forms a lid to the outer chamber. In certain embodiments, the lid system opens (and closes) both the outer chamber and the inner chamber simultaneously. In certain embodiments, the lid-system is movable and/or openable. In certain embodiments, the lid system opens by a hinged or straight lifting movement.

In certain embodiments, the apparatus comprises a feedthrough of at least one in-feed line (or pipeline/pipe) in the lid system (or outer chamber lid).

In certain embodiments, the feedthrough is opening (or openable) in the sense that the at least one in-feed line opens (or is discontinued) upon opening the lid system. In certain embodiments, the feedthrough is opening (or openable) in the sense that it breaks the in-feed line when the lid system is opened (or opens).

In certain embodiments, the outer chamber is cylindrical. In certain embodiments, the lid system laterally extends to outside of the area of outer chamber. In certain embodiments, laterally extending to outside means that the lid system laterally extends to the outside of the outer chamber boundary. The boundary may be defined by the outer chamber wall(s), and obtained in an embodiment, by cutting the outer chamber in its upright orientation by a horizontal plane.

In certain embodiments, the feedthrough is sealed by a seal.

In certain embodiments, the feedthrough of at least one in-feed line is positioned in an area of the lid system that is on the outside of the outer chamber. Accordingly, in certain embodiments, the at least one in-feed line passes through the lid system without passing through the outer chamber. In certain embodiments, the at least one in-feed line merely penetrates through the lid system on the outside of the outer chamber. In certain embodiments, the said feedthrough is a through-hole feedthrough. In certain embodiments, the said feedthrough is a vertical through-hole feedthrough.

In certain embodiments, the lid system closes the outer chamber from the top side of the outer chamber. In certain embodiments, the inner chamber extends through the lid system to the outside of the outer chamber. In certain embodiments, the inner chamber extends to above the outer chamber. In certain embodiments, the lid system is an outer chamber lid. In certain embodiments, the lid system rests on the outer chamber forming a top part of the outer chamber.

In certain embodiments, a device cabinet accommodates the outer chamber. In certain embodiments, the lid system is attached to an apparatus body part or frame. In certain embodiments, the lid system is attached to a part of a device cabinet. In certain embodiments, the device cabinet accommodates the apparatus body part and/or frame. In certain embodiments, the attachment is implemented by a hinge mechanism or by a lift mechanism.

In certain embodiments, the plasma system comprises at least one plasma generator. In certain embodiments, a plasma generator comprises a plasma applicator and a power source. For example, in the case of a microwave plasma generator the plasma generator comprises a microwave power source and a plasma applicator part. Plasma gas flows through the applicator part, and (microwave) power transferred from the (microwave) power source is applied to the plasma gas to form plasma species.

In certain embodiments, the plasma system comprises:
a plasma applicator in the movable (or openable) lid system (or integrated with the lid system).

In certain embodiments, the plasma system comprises a microwave plasma generator and/or a hollow cathode plasma generator.

In certain embodiments, a power source of the plasma generator (whose plasma applicator is in the lid or integrated thereto) is positioned within the apparatus in a position other than the lid (or lid system). Accordingly, the lid in certain embodiments is implemented without the power source of the plasma generator (which may be heavy). In certain embodiments, the power source is positioned within the device cabinet.

Hereinafter, when discussing a plasma generator in the lid or integrated with the lid system it is meant that at least the plasma applicator (or the part, of the plasma generator, through which the plasma gas flows) is in or is integrated with the lid (or lid system).

In certain embodiments, the plasma system comprises a plasma generator having a plasma generation volume. In certain embodiments, the plasma generation volume comprises an array of radiation transmitting antennas. In certain embodiments, the antennas form part of the said plasma applicator part (or plasma applicator).

In certain embodiments, the vertical position of the plasma generation volume and/or the radiation transmitting antennas is above the outer chamber.

In certain embodiments, the radiation transmitting antennas are horizontally oriented (extend or are spread horizontally).

In certain embodiments, the plasma generator comprises an opening or openings for plasma gas to enter the plasma generation volume. The opening(s) may be located in a roof of the plasma generation volume. In certain embodiments, the openings to the plasma generation volume are implemented as a plurality of plasma in-feed line openings in the roof of the plasma generation volume. In certain embodiments, the plasma generation volume forms part of the inner chamber. In certain embodiments, the plasma generation volume and/or the radiation transmitting antennas are positioned above the outer chamber. Plasma is ignited within the plasma generation volume by exposing the plasma gas, arriving from the opening(s), to radiation transmitted by the antennas. In certain embodiments, a further method, such as magnets or UV light can be applied to improve ignition. Formed plasma species flows from the plasma generation volume downwards towards a substrate. A non-plasma gas, e.g., a precursor for thermal ALD may also be passed through the plasma generation volume. In certain embodiments, one or more pipes pass through the area in which the antennas reside. The pipe(s) discharge the non-plasma gas into the plasma generation volume (or into a volume beneath the plasma generation volume) at point(s) which are downstream of the area of the antennas. The pipe(s) are made of material, such as metal, which the radiation transmitted by the antennas cannot penetrate. Accordingly, the non-plasma gas remains unaffected on its way towards the substrate support although it passes through the plasma generation volume.

In certain embodiments, the reaction chamber pressure is kept above 50 Pa during a plasma exposure period (or plasma pulse) of a deposition (or process) cycle. In certain embodiments, the reaction chamber pressure is pumped so as to remain below 50 Pa during a purge period of the process cycle. In certain embodiments, the reaction chamber pressure is kept above 50 Pa during a plasma exposure period of a deposition (or process) cycle and pumped to below 50 Pa for a purge period of the process cycle. In certain embodiments, the pressure is raised back to above 50 Pa at the end of the purge period. In certain embodiments, said purge period is a chemical purge period, i.e., a purge period that follows (or is subsequent to) a chemical pulse (or exposure) period in the process cycle. In certain embodiments, the chemical herein means a non-plasma chemical. In certain embodiments, the pressure is kept below 50 Pa also during the chemical pulse period. In certain embodiments, the pressure is kept below 50 Pa during a purge period that follows (or is subsequent to) a plasma exposure period in the process cycle.

In certain embodiments, the inner chamber (reaction chamber) comprises a reaction chamber bowl.

In certain embodiments, the substrate support resides symmetrically (when viewed from above) with respect to the reaction chamber bowl. In certain embodiments, the substrate support resides concentrically with respect to the reaction chamber bowl.

In certain embodiments, the apparatus comprises a flow guide part in between the plasma system (or plasma generator/applicator) and a reaction chamber bowl. In certain embodiments, the flow guide part is a part that increases channel diameter (the form of the channel may remain unchanged, e.g., round). In certain embodiment, the flow guide part is a part transforming a flow channel cross-section type, e.g., from rectangular to circular (or round). Also in the latter case, the cross-section flow area of the flow channel may be increased by the flow guide part. In certain embodiments, a flow guide part is omitted.

In certain embodiments, the apparatus is configured to press (e.g., by a bowl lift actuator) the reaction chamber bowl against the flow guide part, optionally having a seal therebetween. In certain embodiments, the seal is a vacuum seal. In certain embodiments, the apparatus is configured to press the reaction chamber bowl against the flow guide part, a reaction chamber top part forming the top part of the upper portion of the inner chamber or a reaction chamber counterpart.

In certain embodiments, the reaction chamber bowl is configured to be lowered by a bowl lift actuator (to disengage from the flow guide part (or reaction chamber top part or counterpart) and/or to form a loading gap) for substrate loading.

In certain embodiments, the apparatus comprises a free lateral distance, which prevents plasma wall effects, from the perimeter of the substrate support to a nearest surface of a surrounding reaction chamber bowl. In certain embodiments, the said distance is at least 70 mm. In certain embodiments, the distance is larger than 50 mm, more preferably 50-200 mm, and yet more preferably 65-80 mm.

In certain embodiments, the apparatus comprises a flow guide part in between the plasma system (or plasma generator/applicator) and the reaction chamber bowl. In certain embodiments, said flow guide part herein forms the said reaction chamber counterpart.

In certain embodiments, the substrate support comprises a foot part attached to a bottom (or bottom part) of the lower portion of the inner chamber. Accordingly, in certain embodiments, the substrate support is supported below from the lower portion.

In certain embodiments, the foot part of the substrate support comprises an attachment flange attaching the substrate support to the bottom, the attachment flange residing within the inner chamber, i.e., on vacuum pressure side of the bottom. This facilitates servicing of the apparatus since the substrate support as a whole may, in certain embodiments, then be lifted up from the inner chamber.

In certain embodiments, the lower portion of the inner chamber extends downwards from the reaction chamber bowl. In certain embodiments, the lower portion remains non-heated by the heater positioned in the outer chamber. In certain embodiments, the lower portion has heater(s) separate from the heater (or heaters) heating the upper portion. In certain embodiments, the lower portion forms an inner chamber foot part. In certain embodiments, the reaction chamber bowl has rotational symmetry. In certain embodiments, the reaction chamber bowl comprises an opening at its bottom the lower portion extending from the opening. In certain embodiments, the opening resides symmetrically in the center of the bottom. In certain embodiments, the lower portion has an equal width throughout its length. In certain embodiments, said width equals the width of the (circular/round) opening in the bottom of the reaction chamber bowl. In certain embodiments, the lower portion comprises a connection to a pump line at its side. In certain embodiments, the connection to the pump line resides within the lowest one third of the height of the lower part.

In certain embodiments, the apparatus is configured to guide inactive gas into the outer chamber and the apparatus comprises a route therefrom to a pump line without passing through the inner chamber.

In certain embodiments, the apparatus comprises a heat reflector part moving together with the reaction chamber bowl. In certain embodiments, the heat reflector part closes or at least partly or mainly closes a substrate loading route (or opening) when the reaction chamber bowl is in its upper position. In certain embodiments, the heat reflector part is configured to hinder heat transfer from the outer chamber to a substrate loading channel.

In certain embodiments, the apparatus comprises one or a plurality source chemical cabinets. In certain embodiments, one or more of the source chemical cabinets comprise an exhaust connection. In certain embodiments, the exhaust connection is to a pump line (exhaust line) or similar. In certain embodiments, gas flow from the source chemical cabinet(s) to the exhaust connection(s) keeps the volume within the source chemical cabinet(s) below ambient pressure to prevent leak out from the cabinet(s). In certain embodiments, the source chemical cabinets are purged by inactive gas. In certain embodiments, the source chemical cabinets comprise an inlet and an outlet (exhaust connection) of inactive purge gas. In certain embodiments, the source chemical cabinet(s) are leak tight.

In certain embodiments, the apparatus comprises a first source of plasma gas and a second source of different plasma gas. In certain embodiments, the first plasma gas and second plasma gas travel along a same plasma in-feed line. In certain embodiments, the first plasma gas and second plasma gas travel along a same plasma in-feed line upstream of the lid-system feedthrough. In certain embodiments, the first plasma gas is divided in an ALD valve or pulsing valve to an in-feed line that leads to a first plasma generator and the second plasma gas to an in-feed line that leads to a (separate) second plasma generator. In certain embodiments, the ALD valve or pulsing valve is positioned upstream of the lid-system feedthrough. In certain embodiments, the plasma gas division valve in question is a three-way valve. In certain embodiments, the in-feed line leading to the first plasma generator downstream the lid-system feedthrough travels as an uncovered non-heated pipeline. Similarly, the in-feed line leading to the second plasma generator downstream the lid-system feedthrough travels as an uncovered non-heated pipeline.

In certain embodiments, a plurality of non-plasma gases (for example, non-plasma precursors and/or thermal ALD precursors, such as one or more metal precursors and/or non-metal precursor(s) and/or inactive gases) flow along a common in-feed line both upstream and downstream of the lid-system feedthrough. In certain embodiments, the said common in-feed line of non-plasma gases is a heated and insulated pipeline.

Accordingly, gas supply into the inner chamber or reaction chamber of a substrate processing reactor or apparatus, such as a plasma-enhanced ALD reactor, may be realized with mere three in-feed lines. In certain embodiments, each of the in-feed lines go through the lid system at a common feedthrough point.

In certain embodiments, the feedthroughs in the lid-system are positioned on the side of the lid-system that is opposite to the hinge mechanism containing side of the lid-system.

In certain embodiments, the lid system comprises two plasma generators (one or both plasma generators may be attached to or integrated into the lid system), one for substrate processing and one mainly for cleaning the inner chamber. In certain embodiments, the first plasma generator positioned on the lid-system closes the inner chamber (or reaction chamber). In certain embodiments, the plasma species generated by the first plasma generator for substrate processing is generated within the boundaries of the inner chamber.

In certain embodiments, an optional second plasma generator is a remote plasma generator in which plasma species is generated remotely and transferred via an in-feed line to the inner chamber. In certain embodiments, the top part of the upper portion of the inner chamber has a slanted top corner through which the remotely generated plasma species is fed into the inner chamber so that the feeding direction of the remotely generated plasma species is at least partly downwards.

In certain embodiments, at least the respective plasma applicators of the first and second plasma generator reside in the lid system.

In certain embodiments, the lower portion of the inner chamber comprises two exhaust openings. In certain embodiments, the first exhaust opening is for a turbomolecular pump, and the second exhaust opening is for another exhaust pump (or discharge pump), such as a dry pump. In certain embodiments, an exhaust line via the second exhaust opening by-passes the turbomolecular pump.

In certain embodiments, a first exhaust line extends from the lower portion of the inner chamber via a first valve to a turbomolecular pump, and a second exhaust line extends from the lower portion of the inner chamber via a second valve to another exhaust pump, the first exhaust line joining the second exhaust line at a first joining point downstream from the turbomolecular pump and the second valve and upstream from said another exhaust pump (a non-turbomolecular vacuum pump, such as a dry pump). In certain embodiments, the first valve is a flow restricting control valve, such as a pendulum valve (or a butterfly valve). In certain embodiments, the second valve is a closing valve. In certain embodiments, a third exhaust line extends from the outer chamber to a third valve and joins the second exhaust line at a second joining point downstream from the third valve and upstream from the second valve. In certain embodiments, the third valve is a flow restricting control valve, such as a butterfly valve (or a pendulum valve). In such an exhaust line system, with the second valve open and first valve closed in an embodiment, material (such as gases and/or particles) is removed from the inner chamber via the second exhaust line and second valve to or towards said another exhaust pump without removing material from the inner chamber via the first exhaust line. Further, in such an exhaust line system, with the first and third valve open and second valve closed in an embodiment, material is removed from the outer chamber via a route traveling along the third exhaust line via the third valve and along the second exhaust line to the inner chamber and further from the inner chamber along the first exhaust line via the first valve and turbomolecular pump to exhaust (to or towards said another exhaust pump). In the latter embodiment, the second valve is circumvented.

In certain embodiments, the substrate support comprises said foot part (or pedestal) and a susceptor part on top of the pedestal. In certain embodiments, the susceptor part comprises a rim made of ceramic material (on the edge of the susceptor part).

In certain embodiments, the substrate support comprises lifter pins actuated through the bottom of the lower portion of the inner chamber. In certain embodiments, the substrate support comprises lifter pins with expanding top portions to close, when the lifter pins are in their lower position, through holes that extend through the susceptor part.

In certain embodiments, the apparatus comprises a part (which may be a circular part) around the pedestal to which the lifter pins are attached to vertically move the pins by moving the said part. In certain embodiments, the movement is actuated from below, for example, with a connecting element extending through the bottom of the lower portion of the inner chamber.

In certain embodiments, the upper surface of the susceptor part to support the substrate is uneven. In certain embodiments, the apparatus comprises inside the pedestal a channel to guide protective and/or heat conductive gas, such as helium, into a space in between the susceptor part and a substrate. In certain embodiments, the gas is sucked back from the said space downwards into inside of the pedestal. Accordingly, in certain embodiments, a protective and/or heat conductive gas circulation is provided.

In certain embodiments, the diameter of the exhaust opening (in the side wall of the inner chamber foot part) leading to the exhaust pump is at least 15 cm. In certain more preferred embodiments, the diameter is within the range extending from 15 cm to 30 cm. In yet more preferred embodiments, the diameter is within the range extending from 20 cm to 25 cm.

In certain embodiments, the inner chamber foot part is of cylindrical shape. In certain embodiments, the diameter of the inner chamber foot part is at least 20 cm. In certain more preferred embodiments, the diameter is within the range extending from 20 cm to 50 cm. In yet more preferred embodiments, the diameter is within the range extending from 20 cm to 30 cm.

In certain embodiments, these diameter values or ranges of the exhaust opening and inner chamber foot part apply especially in case there is a turbomolecular pump in the exhaust line. In other embodiments, in particular in those in which the turbomolecular pump is omitted and replaced by another (less effective) vacuum pump the cross-sectional area of the inner chamber foot part and of the exhaust opening may be less. The exhaust opening may then be, for example, of the size KF40 (inner diameter of the pump line around 4 cm) or greater.

In certain embodiment, the inner chamber extends downwards to the outside of outer chamber. In certain embodiments, the height of the extension exceeds the diameter of the inner chamber foot part. In certain embodiments, the height of the extension is at least 25 cm. In certain more preferred embodiments, the height of the extension is at least 30 cm.

In certain embodiments, the vertical distance between the bottom of the inner chamber and the substrate holder top surface is at least 40 cm. In certain more preferred embodiments, the vertical distance between the bottom of the inner chamber and the substrate holder top surface is at least 50 cm. In certain more preferred embodiments, the vertical distance between the bottom of the inner chamber and the substrate holder top surface is within the range extending from 50 cm to 100 cm.

In certain embodiments, the reaction chamber bowl is a part with rotational symmetry. In certain embodiments, the diameter of the reaction chamber bowl is at least 10 cm larger than that of the substrate holder. In certain more preferred embodiments, the diameter of the reaction chamber bowl is at least 14 cm larger than that of the substrate holder.

In certain embodiments, the substrate holder is fitted to support a substrate, for example a wafer, with a diameter of at least 200 mm, more preferably 300 mm or larger.

According to a second example aspect of the invention there is provided a substrate processing apparatus, comprising:
 an inner chamber;
 an outer chamber at least partly surrounding the inner chamber;
 a substrate support to support a substrate in the inner chamber; and
 a plasma system comprising a first plasma generator to generate a first plasma species within the inner chamber and a second plasma generator which is a remote plasma generator to generate a second plasma species on the outside of the inner chamber (and of the outer chamber).

According to a third example aspect of the invention there is provided a substrate processing apparatus, comprising:
 an inner chamber;
 an outer chamber at least partly surrounding the inner chamber;
 a substrate support to support a substrate in the inner chamber;
 a movable (or an openable) lid system; and
 a plasma applicator in the lid system.

In certain embodiments, the lid system is a hinged lid system. In certain embodiments, the lid system is another liftable lid-system, for example, a non-hinged lid system, for example a lift lid that is liftable without changing its orientation. The lid system may be provided with an elevator to lift the hinged or non-hinged lid system depending on the embodiment. In certain embodiments, the lid system is sealed by a seal.

In certain embodiments, the apparatus comprises a feedthrough of at least one in-feed line through the lid system. In certain embodiments, the feedthrough is sealed by a seal.

In certain embodiments, the plasma applicator forms part of a plasma generator. In certain embodiments, the plasma generator further comprises a (plasma) power source. In certain embodiment, also the power source is in the lid system. In other embodiments, the power source is positioned elsewhere in the apparatus.

According to a fourth example aspect there is provided a substrate processing apparatus, comprising:
   an inner chamber;
   an outer chamber at least partly surrounding the inner chamber; and
   a heat reflector part (or plate) in the outer chamber moving together with a reaction chamber bowl to cover a substrate loading opening of the substrate processing apparatus.

According to a fifth example aspect there is provided a substrate processing apparatus, comprising:
   an inner chamber;
   an outer chamber at least partly surrounding the inner chamber; and
   a through-hole feedthrough for at least one gas in-feed line to pass through an outer chamber lid.

In certain embodiments, the feedthrough is sealed by a seal. In certain embodiments, the feedthrough is opening (or openable).

According to a sixth example aspect there is provided a substrate processing apparatus, comprising:
   a reaction chamber (or inner chamber);
   a substrate support;
   a pedestal of the substrate support being attached to a reaction chamber bottom via an attachment flange, the attachment flange residing within the reaction chamber (i.e., on vacuum pressure side of the reaction chamber bottom).

According to a seventh example aspect there is provided a substrate processing apparatus, comprising:
   a reaction chamber (or inner chamber) with a lower portion, the lower portion of the reaction chamber comprising a first exhaust opening for a turbomolecular pump, and a second exhaust opening is for another exhaust pump, an exhaust line traveling via the second exhaust opening by-passing the turbomolecular pump.

According to an eighth example aspect there is provided a substrate processing apparatus, comprising:
   an inner chamber;
   an outer chamber at least partly surrounding the inner chamber, the inner chamber comprising a lower portion, the apparatus comprising an exhaust line from the outer chamber entering the lower portion of the inner chamber and exiting the lower portion towards an exhaust pump via an exhaust opening.

In certain embodiments, the output from the outer chamber and entering the lower portion occurs via a second flow restricting control valve, such as a butterfly valve. In certain embodiments, the exiting towards the exhaust pump occurs via a first flow restricting control valve, such as a pendulum valve. In certain embodiments, the exhaust pump is a turbomolecular pump.

According to a ninth example aspect there is provided a substrate processing apparatus, comprising:
   a reaction chamber (or inner chamber);
   a substrate support;
   a pedestal of the substrate support attached to a reaction chamber bottom; and
   lifter pins of the substrate support whose movement is actuated from below through a connecting element that extends through the bottom of the reaction chamber.

In certain embodiments, the apparatus comprises a part around the pedestal to which the lifter pins are attached to vertically move the pins by moving the said part with the connecting element.

According to a tenth example aspect there is provided a substrate processing apparatus, comprising:
   an inner chamber comprising a reaction chamber bowl, and
   an outer chamber at least partly surrounding the inner chamber, the apparatus being configured to move (e.g., lower and lift) the reaction chamber bowl by actuating the movement of the bowl on (or from) the outside of the outer chamber.

In certain embodiments, the apparatus comprises a sealed feedthrough through the outer chamber, or outer chamber bottom, for a connecting element to pass through and transfer vertical motion to the reaction chamber bowl.

According to an eleventh aspect there is provided a substrate processing apparatus, comprising:
   a reaction chamber (or inner chamber);
   a lid or a lid system comprising a plasma applicator to provide the reaction chamber with plasma species; and
   a cooling arrangement in the lid or lid system.

In certain embodiments, the cooling arrangement comprises a channel attached to or embedded into the lid or lid system for flowing a coolant, such as water.

In certain embodiments,
   sequential self-saturating (or self-limiting) surface reactions are performed on a substrate surface in the reaction chamber.

In certain embodiments, self-saturating surface reactions on a substrate surface are effected by introducing gas phase chemicals and activating the chemicals to a plasma state.

In accordance with certain embodiments, embodiments of any of the second to eleventh aspect are provided, the embodiments comprising:
   subject matter of any single embodiment presented in connection with the first aspect, or the embodiments comprising:
   subject matter of any of the embodiments presented in connection with the first aspect combined with subject matter presented in any other embodiment or embodiments.

In accordance with yet more general aspect of the invention there is provided a substrate processing apparatus comprising:
   a reaction chamber; and
   one or more features of the embodiments disclosed in the present disclosure.

In accordance with further aspects of the invention there are provided methods corresponding to the substrate processing apparatus aspects.

Different non-binding example aspects and embodiments have been illustrated in the foregoing. The above embodiments are used merely to explain selected aspects or steps that may be utilized in implementations of the present invention. Some embodiments may be presented only with reference to certain example aspects. It should be appreciated that corresponding embodiments apply to other example aspects as well. In particular, the embodiments described in the context of the first aspect are applicable to each further aspect. Any appropriate combinations of the embodiments may be formed.

BRIEF DESCRIPTION OF THE DRAWINGS

The invention will now be described, by way of example only, with reference to the accompanying drawings, in which.

DETAILED DESCRIPTION

Figure 1:
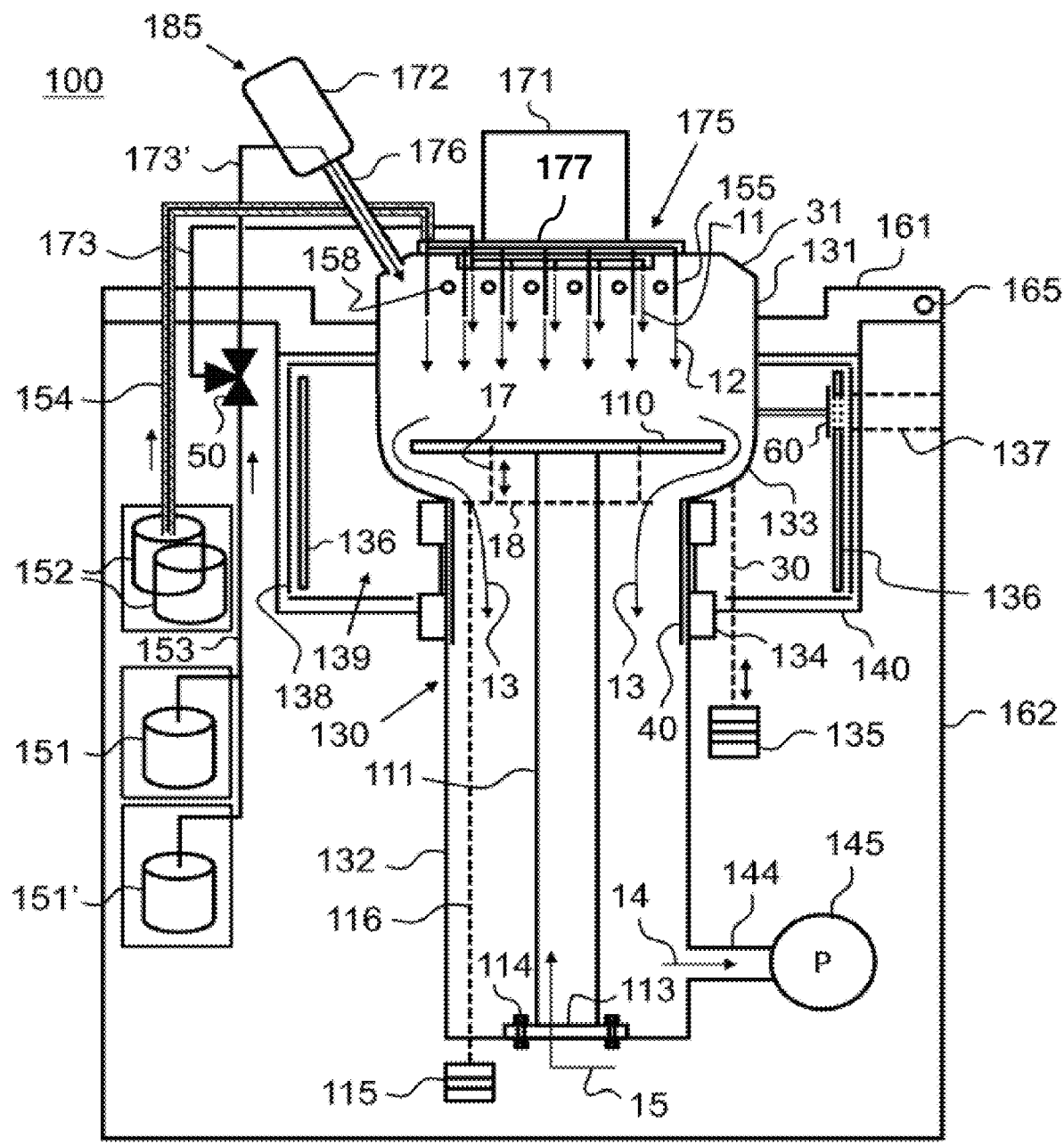
FIG. 1 shows a schematic cross section of an apparatus in accordance with certain embodiments.

In the following description, Atomic Layer Deposition (ALD) technology and Atomic Layer Etching (ALE) technology are used as an example.

The basics of an ALD growth mechanism are known to a skilled person. ALD is a special chemical deposition method based on sequential introduction of at least two reactive precursor species to at least one substrate. A basic ALD deposition cycle consists of four sequential steps: pulse A, purge A, pulse B and purge B. Pulse A consists of a first precursor vapor and pulse B of another precursor vapor. Inactive gas and a vacuum pump are typically used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be either simpler or more complex. For example, the cycles can include three or more reactant vapor pulses separated by purging steps, or certain purge steps can be omitted. Or, as for plasma-assisted ALD, for example PEALD (plasma-enhanced atomic layer deposition) discussed herein, or for photon-assisted ALD, one or more of the deposition steps can be assisted by providing required additional energy for surface reactions through plasma or photon in-feed, respectively. Or one of the reactive precursors can be substituted by energy, leading to single precursor ALD processes. Accordingly, the pulse and purge sequence may be different depending on each particular case. The deposition cycles form a timed deposition sequence that is controlled by a logic unit or a microprocessor. Thin films grown by ALD are dense, pinhole free and have uniform thickness.

As for substrate processing steps, the at least one substrate is typically exposed to temporally separated precursor pulses in a reaction vessel (or chamber) to deposit material on the substrate surfaces by sequential self-saturating surface reactions. In the context of this application, the term ALD comprises all applicable ALD based techniques and any equivalent or closely related technologies, such as, for example the following ALD sub-types: MLD (Molecular Layer Deposition), plasma-assisted ALD, for example PEALD (Plasma Enhanced Atomic Layer Deposition) and photon-assisted or photon-enhanced Atomic Layer Deposition (known also as flash enhanced ALD or photo-ALD).

However, the invention is not limited to ALD technology, but it can be exploited in a wide variety of substrate processing apparatuses, for example, in Chemical Vapor Deposition (CVD) reactors, or in etching reactors, such as in Atomic Layer Etching (ALE) reactors.

The basics of an ALE etching mechanism are known to a skilled person. ALE is a technique in which material layers are removed from a surface using sequential reaction steps that are self-limiting. A typical ALE etching cycle comprises a modification step to form a reactive layer, and a removal step to take off only the reactive layer. The removal step may comprise using a plasma species, ions in particular, for the layer removal.

FIG. 1 shows a schematic cross section of an apparatus 100 in accordance with certain embodiments. The apparatus 100 is a substrate processing apparatus or reactor which is, for example, capable of plasma-enhanced ALD and/or ALE etching. In certain embodiments, the apparatus 100 comprises an inner chamber (or reaction chamber) 130 and an outer chamber (or vacuum chamber) 140 surrounding the inner chamber 130. The apparatus 100 further comprises a substrate support 110 to support a substrate (not shown) in the inner chamber 130.

In certain embodiments, the inner chamber 130 is formed by an upper portion and a lower portion. In certain embodiments, the upper portion comprises a reaction chamber bowl 133 and a reaction chamber top part 131. In certain embodiments, the substrate support 110 supports the substrate within the upper portion of the inner chamber 130, more particularly within the area of the reaction chamber bowl 133. In certain embodiments, the substrate support 110 resides symmetrically with respect to the reaction chamber bowl 133. The lower portion is denoted by reference numeral 132.

In certain embodiments, the apparatus 100 comprises a plasma system to provide the inner chamber 130 with plasma species from the top side of the inner chamber 130 or via the reaction chamber top part 131 (or the plasma species may be generated in the reaction chamber top part 131). In certain embodiments, the plasma system comprises a first plasma generator 175 on the top side of the inner chamber 130 or in the reaction chamber top part 131. In certain embodiments, the plasma generator 175 is a microwave plasma generator or a hollow cathode plasma generator. The plasma generator 175 may have parts both within the inner chamber 130 and outside of the inner chamber 130 depending on the implementation.

In certain embodiments, an optional flow guide part (not shown) resides in between the plasma generator 175 and the reaction chamber bowl 133. In certain embodiments, the flow guide part 131 connects the plasma generator 175 to the reaction chamber bowl 133.

In certain embodiments, the apparatus comprises a reaction chamber bowl movement system 134 actuated by a bowl lift actuator 135. The movement system 134 may comprise, e.g., a vacuum bellows. In certain embodiments, the reaction chamber bowl 133 is configured to be lowered by the movement system 134 as actuated by the bowl lift actuator 135. In certain embodiments, the bowl lift actuator 135 produces vertical movement, for example, with a bellows comprised by the actuator 135. The vertical movement is connected by a connector or connecting element 30 to the reaction chamber bowl 133 or to a side of the reaction chamber bowl 133. In certain embodiments, the connecting element 30 is a rod. In certain embodiments, the movement system 134 such as a bellows, e.g., an edge welded bellows, allows vertical movement of the reaction chamber bowl 133. In certain embodiments, the movement system 134 forms part of the lower portion of the inner chamber 130 or its side wall. In certain embodiments, a tubular part 40 attached to the inner chamber wall in the area covered by the movement system 134 protects the movement system from inside of the inner chamber 130. In certain embodiments, the tubular part 40 provides a smooth inner surface in the area of the movement system 134.

Vertical movement of the reaction chamber bowl disengages the bowl 133 from the reaction chamber top part 131. In certain embodiments, the vertical movement of the bowl 133 forms a loading gap 239 (see FIG. 2) for substrate loading. Substrate may then be loaded onto the substrate support 110 from a side via a loading channel 137 as depicted by arrow 20. The loading channel 137 may be a horizontal channel passing through the outer chamber 140.

In certain embodiments, the apparatus 100 is configured to press the reaction chamber bowl 133 against the reaction chamber top part 131 (or the optional flow guide part or another reaction chamber counterpart as the case may be). In certain embodiments, the interface between the reaction chamber bowl 133 and the counterpart is a metal-metal attachment. In certain embodiments, the interface between the reaction chamber bowl 133 and the counterpart is sealed by a seal positioned therebetween. In certain embodiments, the said seal is a vacuum seal. In practice, the pressing may be implemented by the movement system 134 as actuated by the bowl lift actuator 135.

In certain embodiments, the outer chamber 140 surrounds the upper portion of the inner chamber 130 whereas the lower portion 132 extends to the outside of the outer chamber 140 and remains uncovered by the outer chamber 140.

In certain embodiments, the apparatus 100 comprises a heater (or heaters) 136 in the outer chamber 140 to heat the upper portion of the inner chamber 130.

In certain embodiments, the apparatus 100 comprises heat reflectors 138 in the outer chamber 140. The heat reflectors 138 may be positioned in between the heater 136 and outer chamber wall or walls. It is understood that the heat reflectors 138 may extend to each side (side surface(s), top and bottom surfaces) of the outer chamber 140 to enclose the reaction chamber bowl 133 from the sides as a thermos bottle structure or similar. In certain embodiments, the heat reflectors 138 are implemented by heat reflector plates (or a set of heat reflector plates with a plurality of plates, or at least three plates, on top of each other).

The outer chamber 140 encloses the upper portion of the inner chamber 130 at least partly. In certain embodiments, the reaction chamber top part 131 extends to the outside of (or above) the outer chamber 140 and remains at least mainly uncovered by the outer chamber 140.

In certain embodiments, the apparatus 100 comprises a heat reflector part 60 that moves together with the reaction chamber bowl 133. In certain embodiments, the heat reflector part 60 closes the loading channel 137 when the reaction chamber bowl 133 is in its upper position. The loading channel 137 can comprise heat-sensitive parts, such as a gate valve. Heat transfer from the (heated) outer chamber 140 to the loading channel 137 is therefore not desired. In certain embodiments, the heat reflector part 60 is configured to hinder heat transfer from the outer chamber 140 to the substrate loading channel 137 by closing the loading channel 137 from the outer chamber side. The heat reflector part 60 in certain embodiments comprises a heat reflector plate or a plurality of heat reflector plates on top of each other. In certain embodiments, the heat reflector part 60 is fixed to the reaction chamber bowl 133.

Figure 2:
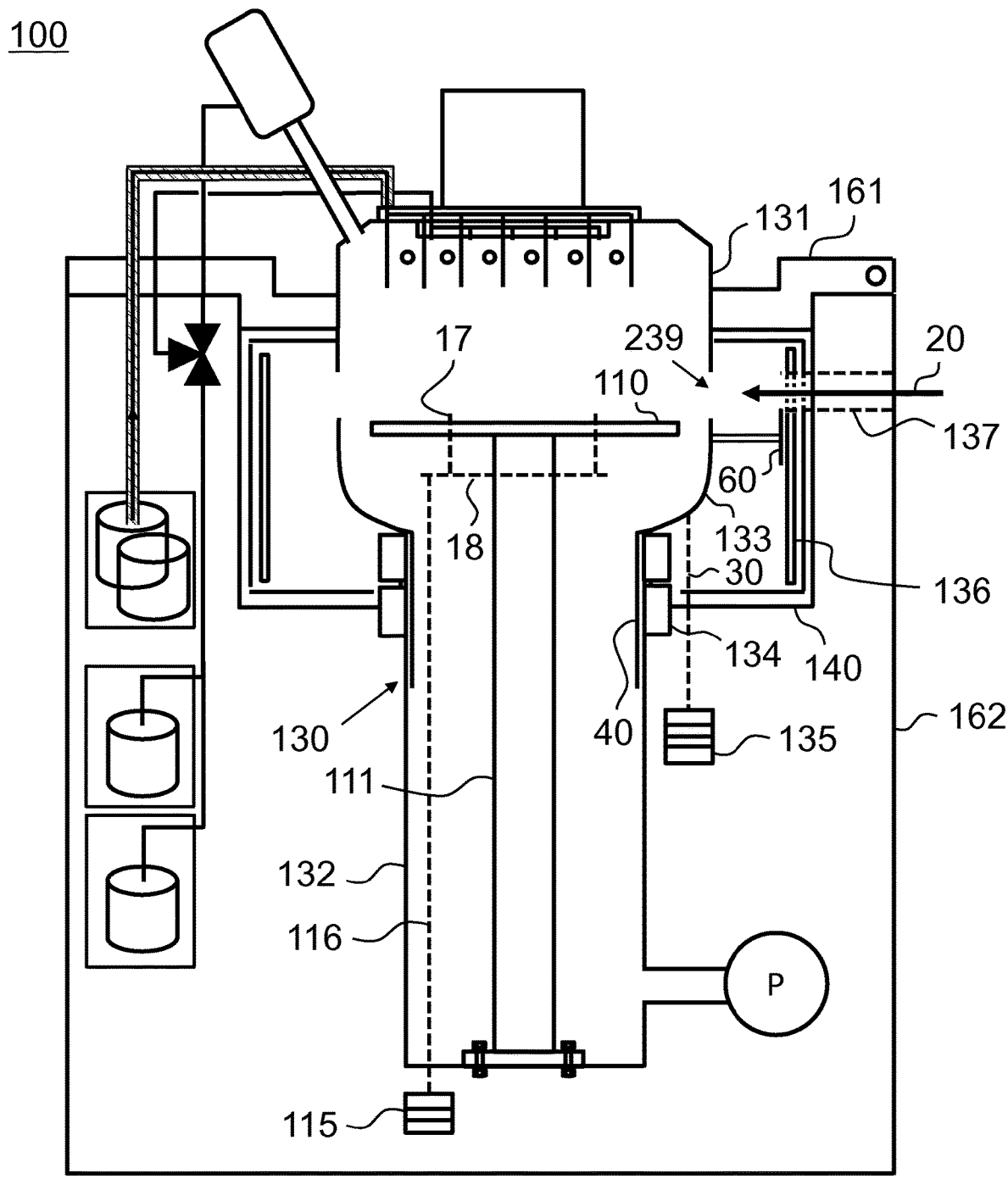
FIG. 2 shows the apparatus of FIG. 1 in a substrate loading state in accordance with certain embodiments.
Figure 3:
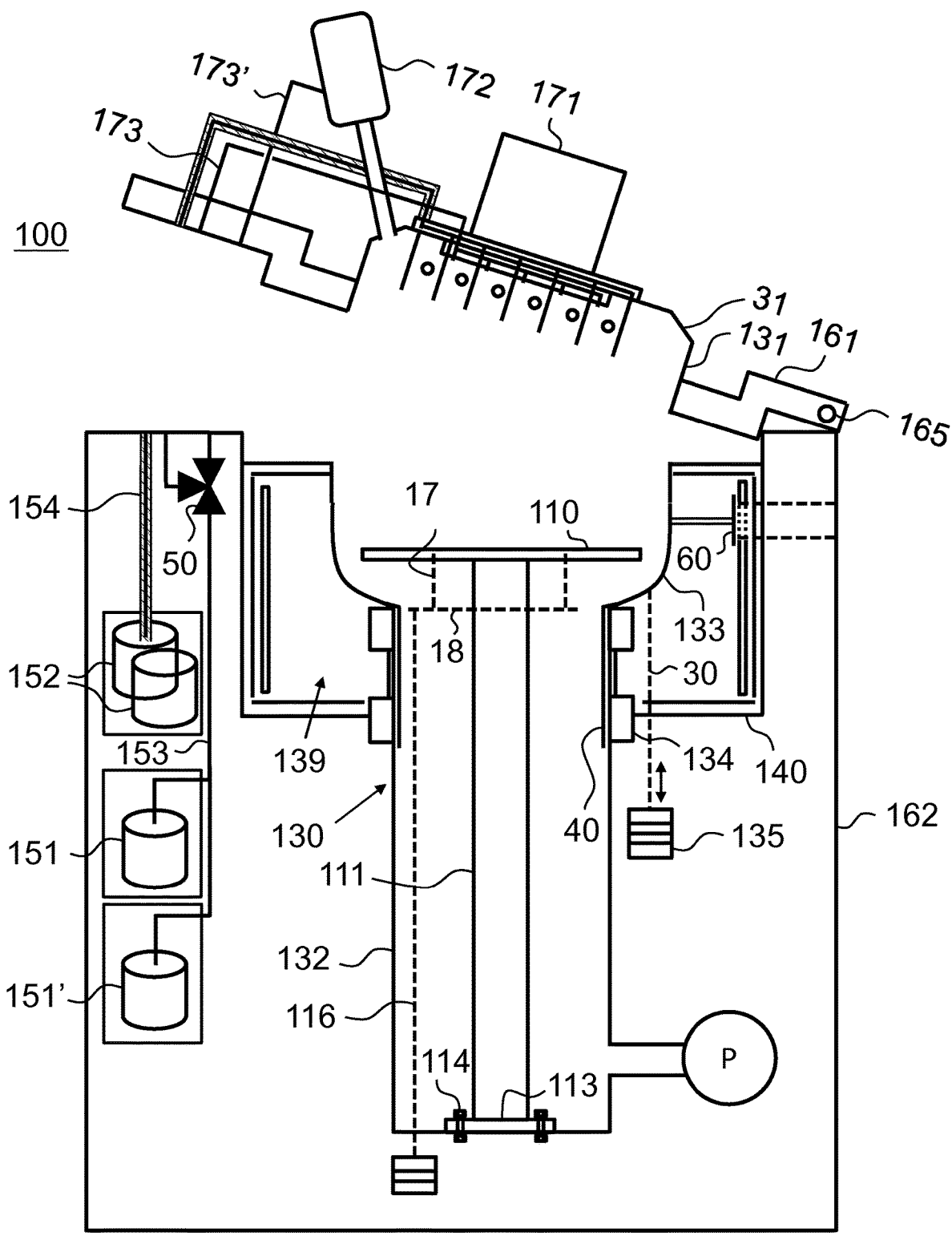
FIG. 3 shows the apparatus of FIG. 1 with its lid system in an open position in accordance with certain embodiments.

In certain embodiments, the lower portion 132 of the inner chamber extends downwards from the reaction chamber bowl 133. In certain embodiments, the lower portion 132 remains non-heated by the heater 136 positioned in the outer chamber 140. In certain embodiments, the lower portion 132 has heater(s) separate from the heater (or heaters) 136 heating the upper portion. In certain embodiments, the apparatus 100 comprises a heater or heaters on the outside of the lower portion 132 to heat the lower portion 132. In certain embodiments, the apparatus 100 comprises heat reflector(s) in the connection of the heater or heaters heating the lower portion 132. In certain embodiments, the heat reflectors are arranged in a similar or corresponding manner as the heat reflectors 138. In certain embodiments, the lower portion 132 forms kind of an inner chamber foot part. In certain embodiments, the reaction chamber bowl 133 comprises an opening at its bottom the lower portion 132 of the inner chamber extending from the opening. In certain embodiments, the opening resides symmetrically in the center of the bottom of the reaction chamber bowl 133. In certain embodiments, the lower portion 132 of the inner chamber has an equal width throughout its length. In certain embodiments, said width equals the width of the (circular/round) opening in the bottom of the reaction chamber bowl 133. In certain embodiments, the lower portion 132 comprises a connection to a pump line 144. In certain embodiments, as depicted in FIGS. 1-3, the pump line 144 can be at the side of the lower portion 132. In certain embodiments, the connection to the pump line 144 resides within the lowest one third of the height of the lower part 132. The pump line 144 has an appropriate pump 145, or multiple pumps to provide the inner chamber 130 with a required level of vacuum. In certain embodiments, the pump 145 is a vacuum pump, and a turbomolecular pump in certain embodiments. In certain embodiments, the pump line 144 comprises at least one valve (not shown in FIG. 1), selected from a group comprising open/close valves, and flow restricting control valves such as pendulum valves, butterfly valves and gate-valves. In certain embodiments, the pump line 144 comprises a valve configuration that is adjustable to alter the pressure of the inner chamber in between 10 mbar to 1 µbar, optionally in combination with incoming chemicals (or gases). In certain embodiments, the pressure of the inner chamber (reaction chamber) is kept constantly above 0.5 mbar (50 Pa). In certain embodiments, this may avoid certain sputtering effects. In certain embodiments, the reaction chamber pressure is kept above 50 Pa during a plasma exposure period (or plasma pulse) of a deposition (or process) cycle. In certain embodiments, the reaction chamber pressure is pumped so as to remain below 50 Pa during a purge period of the process cycle. In certain embodiments, the reaction chamber pressure is kept above 50 Pa during a plasma exposure period of a deposition (or process) cycle and pumped to below 50 Pa for a purge period of the process cycle. In certain embodiments, the pressure is raised back to above 50 Pa at the end of the purge period. In certain embodiments, said purge period is a chemical purge period, i.e., a purge period that follows (or is subsequent to) a chemical pulse (or exposure) period in the process cycle. In certain embodiments, the chemical herein means a non-plasma chemical. In certain embodiments, the pressure is kept below 50 Pa also during the chemical pulse period. In certain embodiments, the pressure is kept below 50 Pa during a purge period that follows (or is subsequent to) a plasma exposure period in the process cycle.

In certain embodiments, the pump line 144 further comprises gas inlet(s) from an intermediate space 139 (a volume defined in between the inner chamber and the outer chamber wall(s)). The pump line 144 with the inlets may be adapted so that flow backwards to the inner chamber is prevented. In certain embodiments, flow from the intermediate space 139 is directed to a pump separate from the (primary) pump 145. In certain embodiments, the pump line configuration keeps a pressure difference between the inner chamber 130 and the intermediate space 139 (the pressure in the intermediate space 139 being higher). In certain embodiments, cross talking between gases in the inner chamber 130 and outer chamber 140 is minimized by minimizing direct gas passageways between these chambers.

In certain embodiments, the substrate support 110 comprises a foot part (or pedestal) 111 attached to a bottom (or bottom part) of the lower portion 132 of the inner chamber 130. In certain embodiments, the foot part 111 of the substrate support comprises an attachment flange 113 attaching the substrate support 110 to the bottom. In certain embodiments, the attachment flange 113 resides within the inner chamber 130, i.e., on vacuum pressure side of the inner chamber bottom. The attachment flange 113 may be fastened to the bottom by fastening means, such as bolts 114.

In certain embodiments, the apparatus 100 comprises a movable such as an opening or an openable lid system 161 (on the top side of the inner chamber 130 and/or outer chamber 140). In certain embodiments, the lid system 161 is attached to a body part or frame 162 of the apparatus by a joint attachment, for example, by a hinge or hinges 165. In certain embodiments, the lid system 161 is attached to a part of a device cabinet. In certain embodiments, the device cabinet accommodates the apparatus body part and/or frame 162.

FIG. 3 more closely shows the lid system 161 in an open position, supported by the hinge joint 165. The movable lid system 161 facilitates servicing of the apparatus 100. Instead of a hinged lid system 161 the apparatus in certain embodiments comprises another liftable lid system such as a movable lift lid (which may be non-hinged and operated by an elevator).

In certain embodiments, the lid system 161 closes the outer chamber 140 from the top side of the outer chamber 140. Accordingly, in certain embodiments, the lid system 161 forms an outer chamber lid. In certain embodiments, the lid system 161 is sealed against the outer chamber 140 by a seal. In certain embodiments, the lid system 161 comprises a feedthrough for at least one in-feed line (or pipeline/pipe) to pass from a first side of the lid system 161 to the other side of the lid system 161.

In certain embodiments, the plasma generator 175, or at least a plasma applicator of the plasma generator 175, is positioned in the movable (or openable) lid system 161 (or integrated with the lid system 161).

In certain embodiments, the plasma generator 175 comprises a plasma generation volume and an opening or openings for plasma gas to enter the plasma generation volume as depicted by arrows 11. The said plasma gas can be a combination of a plurality of gases. In certain embodiments, the vertical position of the plasma generation volume is above the outer chamber 140.

In certain embodiments, the plasma generation volume comprises an array of radiation transmitting antennas 158 that form part of the plasma applicator. In certain embodiments, the vertical position of the radiation transmitting antennas 158 is above the outer chamber 140. The opening(s) to the plasma generation volume may be located in a roof of the plasma generation volume. In certain embodiments, the openings to the plasma generation volume are implemented as a plurality of plasma in-feed line openings in the roof of the plasma generation volume. In certain embodiments, the plasma generation volume forms part of the inner chamber 130. In certain embodiments, the plasma generation volume and/or the radiation transmitting antennas 158 are positioned above the outer chamber 140.

In certain embodiments, the plasma generator 175 comprises the plasma applicator and a power source. In certain embodiments, the power source of the plasma generator 175 (whose plasma applicator is in the lid system 161) is positioned within the apparatus 100 in a position other than the lid system 161. Accordingly, the lid system 161 in certain embodiments is implemented without the power source of the plasma generator 175. In certain embodiments, the power source is positioned within the device cabinet.

Plasma is ignited within the plasma generation volume by exposing the plasma gas, arriving from the opening(s), to radiation transmitted by the antennas 158 (that form part of the plasma applicator). In certain embodiments, a further method, such as magnets or UV light can be applied to improve ignition. Formed plasma species flows from the plasma generation volume downwards towards the substrate support 110 supporting at least one substrate (not shown). Plasma species can include radicals and ions. A non-plasma gas, e.g., a precursor for thermal ALD may also be passed through the plasma generation volume (i.e., the area in which the antennas 158 reside). In certain embodiments, one or more pipes 155 pass through the area in which the antennas reside. The pipe(s) 155 discharge the non-plasma gas (or gases) into a volume beneath the plasma generation volume at point(s) which are downstream of the area of the antennas 158, as depicted by arrows 12. The pipe(s) are made of material, such as metal, which the radiation transmitted by the antennas 158 cannot penetrate. Accordingly, the non-plasma gas (or gases) remains unaffected on its way towards the substrate support 110 although it passes through the plasma generation volume.

In certain embodiments, the apparatus comprises a plurality source chemical cabinets. The source chemical cabinets are shown in FIGS. 1-3 as rectangles drawn around source chemical containers 151, 151' and 152. A plurality of source chemical containers may be positioned within one cabinet. In certain embodiments, the source chemical cabinets are leak tight. In certain embodiments, the source chemical cabinets are purged by inactive gas. In certain embodiments, the source chemical cabinets comprise an inlet and an outlet of inactive purge gas.

In certain embodiments, the apparatus comprises a source 151 of first plasma gas and a source 151' of second, different, plasma gas. In certain embodiments, the first plasma gas and second plasma gas travel along a same plasma in-feed line 153 towards the plasma system. The in-feed line 153 arrives, upstream of the lid system feedthrough, at an ALD valve or pulsing valve 50 where it is divided into two in-feed lines 173 and 173'. In certain embodiments, the valve 50 is a three-way valve.

The in-feed line 173 leads to the (first) plasma generator 175, and the in-feed line 173' to a (separate) second plasma generator 185. The first and second plasma gas in-feed lines 173, 173' pass through the lid-system feedthrough to the other (i.e., upper) side of the lid system 161. The first plasma gas in-feed line 173 leading to the first plasma generator 175 downstream the lid-system feedthrough travels as an uncovered non-heated pipeline in certain embodiments. Similarly, the second plasma gas in-feed line 173' leading to the second plasma generator 185 downstream the lid-system feedthrough travels as an uncovered non-heated pipeline in certain embodiments. However, in certain embodiments, the in-feed lines 173 and 173' are heated. The in-feed lines 173 and 173' downstream the feedthrough may be surrounded by ambient pressure (i.e., non-vacuum pressure).

In certain embodiments, a plurality of sources 152 of non-plasma precursors or non-plasma chemicals (for example, non-plasma precursors and/or thermal ALD precursors, such as one or more metal precursors and/or non-metal precursor(s) and/or inactive gases) are contained in one or more source chemical cabinets. The apparatus 100 comprises a common in-feed line 154 to feed these chemicals into the inner chamber 130. The in-feed line 154 in certain embodiments passes through the lid-system 161 at the said feedthrough. In certain embodiments, the common (non-plasma vapor) in-feed line 154 is implemented as a heated and insulated pipeline both upstream and downstream of the lid-system feedthrough.

Accordingly, gas supply into the inner chamber 130 or reaction chamber of a substrate processing reactor or apparatus 100, such as a plasma-enhanced ALD reactor, may be realized with mere three in-feed lines 153/173, 153/173', and 154. In certain embodiments, each of the in-feed lines go through the lid system 161 at a common feedthrough point.

In certain embodiments, the feedthroughs in the lid-system 161 are positioned on the side of the lid-system 161 that is opposite to the hinge mechanism 165 containing side of the lid-system 161.

In certain embodiments, the lid system 161 comprises two plasma generators (or at least their plasma applicators, if any), one (plasma generator 175) for substrate processing and one (plasma generator 185) mainly for cleaning the inner chamber 130. In certain embodiments, the first plasma generator 175 positioned on the lid-system 161 closes the inner chamber (or reaction chamber) 130. In certain embodiments, the plasma species generated by the first plasma generator 175 for substrate processing is generated within the boundaries of the inner chamber 130.

In certain embodiments, the second plasma generator 185 is a remote plasma generator in which plasma species is generated remotely and transferred via an in-feed line 176 to the inner chamber 130. In certain embodiments, the top part of the upper portion of the inner chamber has a slanted top corner 31 through which the remotely generated plasma species is fed into the inner chamber 130 so that the feeding direction of the remotely generated plasma species is at least partly downwards. In certain embodiments, the plasma species entering the inner chamber from the in-feed line 176 mainly or only contains radicals. In other words, the majority or all of the ions possible generated by the remote plasma generator have been recombined by that time they reach the chamber 130. In certain other embodiments, the majority or all of the ions possible generated by the remote plasma generator have been recombined at least by that time they reach the lower portion 132 of the inner chamber.

The route of the non-plasma chemicals (or precursor) either passes through the plasma generator 175 by connecting the in-feed line 154 to the pipes 155 as shown in FIGS. 1-3 or by-passes the plasma generator 175 and enters the inner chamber 130 for example form a side or sides of the inner chamber 130. In certain embodiments of the latter case, the apparatus comprises openings downstream of the plasma generation volume in the sidewall(s) of the inner chamber 130. In certain embodiments, the openings are arranged in the reaction chamber top part 131. The openings may be arranged in the form of a ring that circles around the reaction chamber top part 131 or inner chamber cylindrical side wall.

In certain embodiments, as already described in the preceding the apparatus 100 comprises a feedthrough of at least one in-feed line passing through the lid system 161. The in-feed lines from source chemical containers (151, 151' and 152 in FIGS. 1-3) extend from the respective containers to the feedthrough. As shown in FIG. 3, upon opening the lid system 161, each of these in-feed lines that extend to the feedthrough is discontinued (disconnected) at an interface in which in-feed line portions approaching the lid system 161 from different sides meet. Upon opening, a first part of an lid system 161 and lid 161 in-feed line remains connected to the (opened) lid system 161, and a remaining (second) part remains connected to the body part or frame 162 in certain embodiments. Upon closing the lid system 161 the in-feed line reconnects at the interface. In certain embodiments, the interface is sealed by a seal, for example, an a-ring seal. In an implementation, an a-ring seal is positioned into a groove arranged in the lid system 161 or its countersurface (on the apparatus body part 162 side of the interface).

In certain embodiments, instead of directly connecting the in-feed line 154 to the opening(s) through which plasma gas enters the plasma generation volume, the plasma generator 175 comprises an expansion volume 177 upstream of the said opening(s) to which the plasma gas first flows for spreading before entering the plasma generation volume through said opening(s).

Chemicals from the upper portion of the inner chamber 130 flow to the lower portion 132 as depicted by arrows 13 and further to the pump line 144 as depicted by arrow 14.

In certain embodiments, the apparatus comprises a free lateral distance, to prevent plasma wall effects, from the perimeter of the substrate support 110 to a nearest surface of a surrounding reaction chamber bowl 133. In certain embodiments, the said distance is at least 70 mm. In certain embodiments, the distance is larger than 50 mm, more preferably 50-200 mm, and yet more preferably 65-80 mm.

In certain embodiments, the apparatus 100 is configured to guide inactive gas into the outer chamber 140 (more particularly into an intermediate space 139 defined in between the upper part of the inner chamber and the outer chamber wall(s)) and therefrom to the pump line 144 without passing through the inner chamber 130.

In certain embodiments, the apparatus 100 comprises a radiation generating device (or power source), or a microwave generator, or a magnetron 171 serving the plasma generator 175. In certain embodiments, the radiation generating device 171 is attached to or integrated into the lid system 161, and it generates the required radiation for the antennas 158. In certain embodiments, the radiation generating device 171 forms part of the plasma generator 175.

In certain embodiments, the second plasma generator 185 comprises its own radiation generating device 172 to generate frequencies required by the second plasma generator 185. Alternatively, depending on the plasma generator type of the second plasma generator 185 the device 172 can be omitted or replaced with another plasma generator type specific device, and the second plasma species may be formed by another method, for example, inductively coupled plasma etc.

In certain embodiments, the optional flow guide part is a part that increases channel diameter (the form of the channel may remain unchanged, e.g., round). In certain embodiment, the flow guide part is a part transforming a flow channel cross-section type, e.g., from rectangular to circular (or round). This may be useful if the cross-sectional form of the part 175 is rectangular, for example. Also in the latter case, the cross-section flow area of the flow channel may be increased by the flow guide part. In certain embodiments, the flow guide part 131 comprises openings in a ring-like fashion for non-plasma gas (or precursor/reactant) to enter the inner chamber 130. In certain embodiments, an inwardly protruding or pointing sacrifice surface or sacrifice ring may be arranged in the flow guide part. The vertical position of the sacrifice ring is below the openings (preferably in the immediate proximity of the openings).

In certain embodiments, the substrate support 110 comprises said foot part (or pedestal) 111 and a susceptor part on top of the pedestal 111. The substrate support 110 comprises lifter pins 17 actuated through the bottom of the lower portion 132 of the inner chamber 130. The pins 17 are vertically movable in respective vertical through holes arranged in the susceptor part. A substrate is loaded onto the susceptor part by receiving the substrate from the loading channel 137 and loading gap 239 onto lifted pins 17. The pins 17 are thereafter lowered so that only a small gap remains in between the susceptor part and the substrate.

In certain embodiments, the apparatus comprises a pin lift actuator 115 positioned on the outside of the inner chamber 130. In certain embodiments, the pin lift actuator 115 is configured to actuate vertical movement of the substrate support pins 17. In certain embodiments, a feedthrough from the pin lift actuator 115 into the inner chamber 130 is arranged through the inner chamber bottom, e.g., at the area of the flange 113 in certain embodiments, or preferably outside of the area of the flange 113. The arrow 15 depicts feedthroughs for cooling fluid, and/or heating fluid and/or substrate backside protecting gas through the inner chamber bottom arranged, e.g., at the area of the flange 113 in certain embodiments.

In certain embodiments, the apparatus comprises a part 18 (which may be a circular part) around the pedestal 111 to which the lifter pins 17 are attached to vertically move the pins by moving the said part 18. In certain embodiments, the movement of the part 18 and thereby also the movement of the pins 17 is actuated from below, for example, with a connecting element (or rod) 116 extending through the bottom of the lower portion of the inner chamber 130.

In certain embodiments, the substrate support 110 is rotatable. In certain embodiments, the substrate support is rotatable around a vertical rotation axis. In certain embodiments, rotation of the substrate support 110 is generated by the foot part 111 and/or transmitted via the inner chamber 130 bottom or the flange 113. In certain embodiments, the substrate is rotated with less than one revolution per cycle on the substrate support 110.

During substrate processing, one or more substrates supported by the substrate holder 110 are processed within the inner chamber 130 as desired, such as by ALD or PEALD or ALE. For example, the substrate surface may be alternately exposed to
- a first reactive chemical and a second (another) reactive chemical;
- a first reactive chemical and a second reactive chemical complemented by plasma;
- a first reactive chemical and plasma (single precursor process); or
- a first reactive chemical to produce a reactive layer and a second reactive chemical (or ions) to remove the formed reactive layer.

In the last-mentioned processing method, the removal of the formed reactive layer may be obtained by ion bombardment. In certain embodiments, the plasma system provides the substrate surface with ions from one of the plasma generators (or the first plasma generator 175) and plasma without ions (e.g., mere radicals) from the other plasma generator (or the second plasma generator 185). In certain embodiments, due to the application of two plasma sources of which the first plasma source 175 in certain embodiments provides the substrate with both plasma radicals and ions but the second plasma source 185 only radicals, a substrate processing cycle comprising both a deposition step and an etching step (or a layer removal step) is obtained. In certain embodiments, both the former step (deposition step or reactive layer generation step) and the latter step (removal) are implemented as plasma enhanced steps, while in other embodiments the former step is performed without plasma enhancement but the latter step is performed with plasma enhancement. Accordingly, there are embodiments in which the second plasma source 185 may be used for a purpose other than mere cleaning.

As to the cleaning operation, in certain embodiments, the second plasma generator (remote plasma generator) applies F-gases, such as $NF_3$ or $CF_4$ for in-situ cleaning of the interior surface inner chamber 130. In-situ cleaning, for example with NF3 plasma or CF4 plasma, provides a longer period for utilizing the reactor without the need to open it for a cleaning service.

Figure 4:
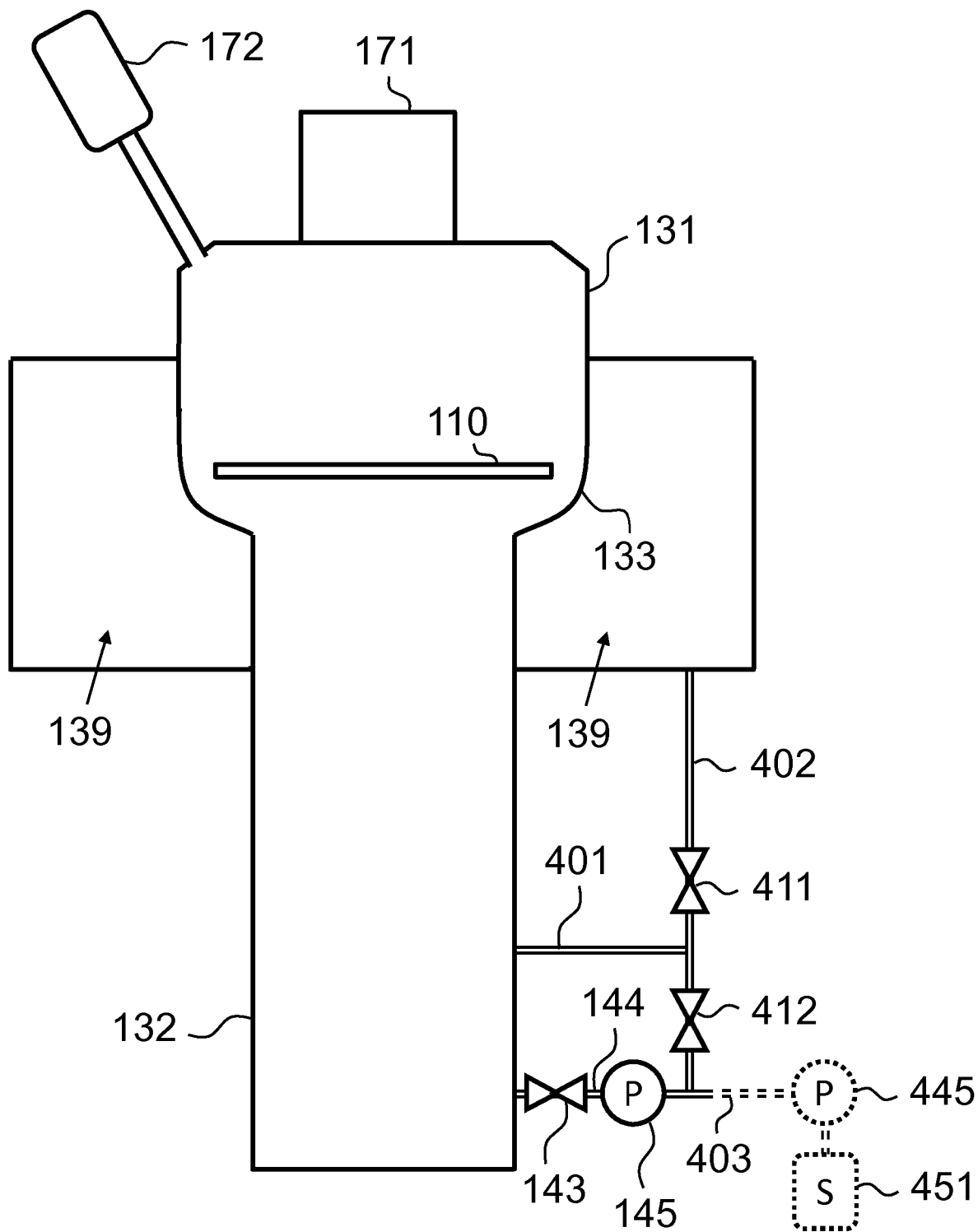
FIG. 4 shows an exhaust system in accordance with certain embodiments.

FIG. 4 shows an exhaust system for the apparatus 100 in accordance with certain embodiments. In certain embodiments, the lower portion 132 of the inner chamber comprises two exhaust openings. In certain embodiments, the first exhaust opening is for a turbomolecular pump 145, and the second exhaust opening is for another exhaust pump 445 (or discharge pump), such as a dry pump. In certain embodiments, an exhaust line 401 via the second exhaust opening by-passes the turbomolecular pump 145.

In certain embodiments, a first exhaust line (or pump line, or vacuum line) 144 begins at the first exhaust opening and extends from the lower portion 132 of the inner chamber via a first valve 143 to the turbomolecular pump 145. A second exhaust line 401 begins at the second exhaust opening and extends from the lower portion 132 of the inner chamber via a second valve 412 to said another exhaust pump 445. The first exhaust line 144 joins the second exhaust line 401 at a first joining point and continues as a common joined exhaust line 403 towards the exhaust pump 445 and therefrom further to an optional scrubber 451 or similar. The first joining point is located downstream from the turbomolecular pump 145 and the second valve 412 and upstream from said another exhaust pump 445 (a non-turbomolecular vacuum pump, such as the dry pump). In certain embodiments, the first valve 143 is a first flow restricting control valve, such as a pendulum valve. In certain embodiments, the second valve 412 is a closing valve.

In certain embodiments, a third exhaust line 402 extends from the outer chamber 140 to a third valve 411 and joins the second exhaust line 401 at a second joining point downstream from the third valve 411 and upstream from the second valve 412. In certain embodiments, the third valve 411 is a second flow restricting control valve, such as a butterfly valve.

In such an exhaust line system, with the second valve 412 open and first valve 143 closed in an embodiment, material (such as gases and/or particles) is removed from the inner chamber 130 via the second exhaust line 401 and second valve 412 to or towards said another exhaust pump 445 without removing material from the inner chamber 130 via the first exhaust line 144 (thereby circumventing the turbomolecular pump 145).

Further, in such an exhaust line system, with the first valve 143 and third valve 411 being open and the second valve 412 closed in an embodiment, material is removed from the outer chamber 140 via a route traveling along the third exhaust line 402 via the third valve 411 and along the second exhaust line 401 to the inner chamber 130 (or its lower portion 132) and further from the inner chamber 130 along the first exhaust line 144 via the first valve 143 and turbomolecular pump 145 to exhaust (to or towards said another exhaust pump 445). In the latter embodiment, the flow from the intermediate space 139 turning at the second joining point towards the inner chamber 130 circumvents the second valve 412. Accordingly, the outgoing flow from the intermediate space flows via the turbomolecular pump 145.

In certain other embodiments, the turbomolecular pump 145 is omitted and replaced by another (less effective) vacuum pump. Independently of the pump type of pump 145 the first valve 143 may be implemented by a flow restricting control valve.

In certain embodiments, the exhaust line 401 by-passing the pump 145 is optional.

Figure 5:
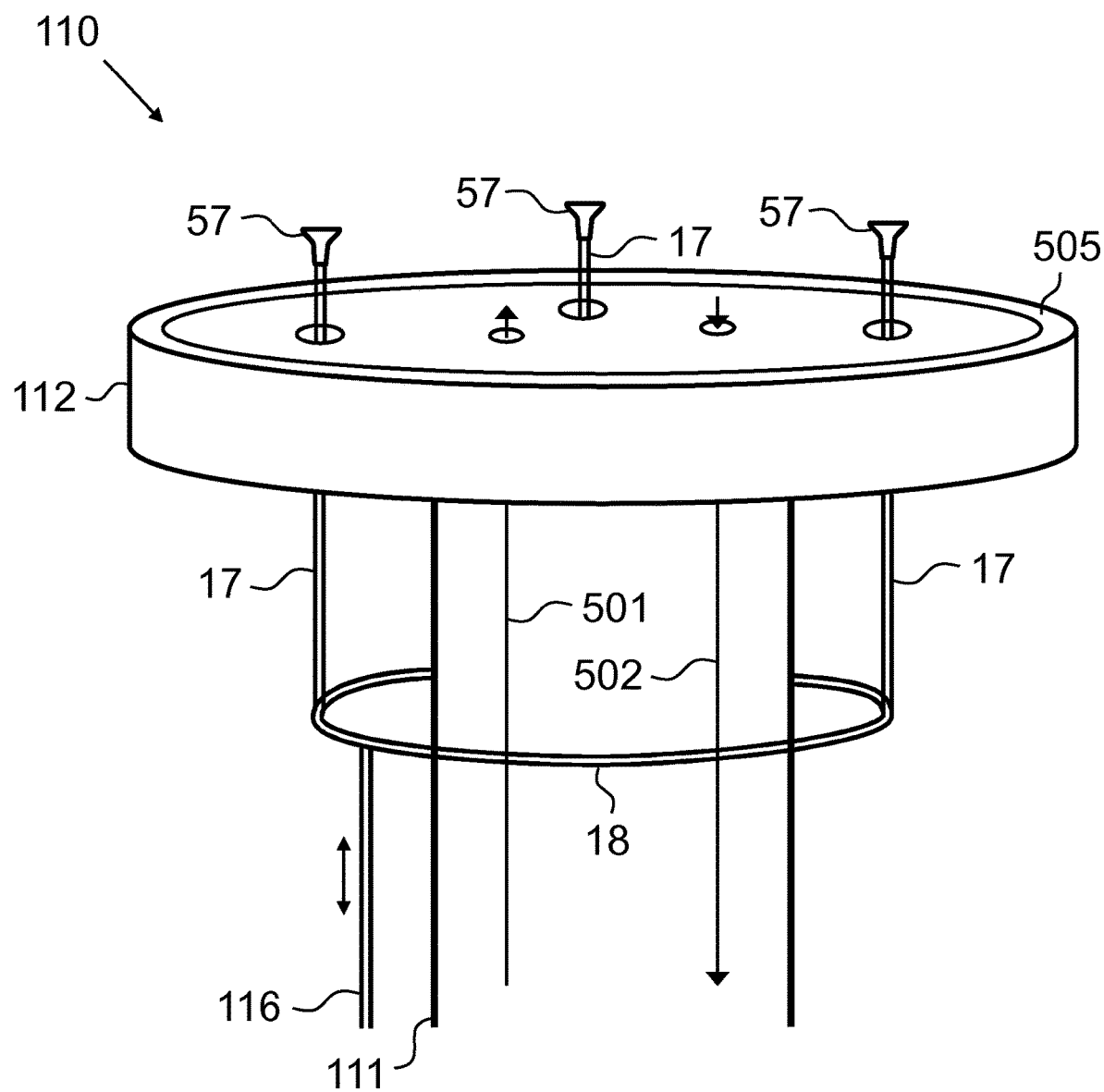
FIG. 5 shows a substrate support in accordance with certain embodiments.

FIG. 5 shows a substrate support 110 for the apparatus 100 in accordance with certain embodiments. A susceptor part 112 resides on top of the pedestal 111. In certain embodiments, the susceptor part 112 is of a cylindrical form. In certain embodiments, the susceptor part 112 comprises a rim 505 made of ceramic material (on the edge of the susceptor part 112). In certain embodiments, the height of the rim 505 is substantially the same, or is of the same magnitude, as the thickness of the substrate.

In certain embodiments, the lifter pins 17 have expanding top portions 57 to close, when the lifter pins 17 are in their lower position, through holes that extend through the susceptor part 112.

In certain embodiments, the upper surface of the susceptor part 112 to support the substrate (not shown) is uneven. In certain embodiments, the apparatus 100 comprises inside the pedestal 111 a channel 501 to guide protective gas, such as helium, into a space in between the susceptor part 112 and the substrate above it. In certain embodiments, the protective gas is sucked back from the said space downwards into inside of the pedestal 111 as depicted by the arrow 502. Accordingly, in certain embodiments, a substrate backside protective gas circulation is provided.

In certain embodiments, there is a fluid (e.g., cooling liquid) circulation within the susceptor part 112 effected via the pedestal 111.

In certain embodiments, the diameter of the exhaust opening (in the side wall of the inner chamber foot part) leading to the exhaust pump 145 is at least 15 cm. In certain more preferred embodiments, the diameter is within the range extending from 15 cm to 30 cm. In yet more preferred embodiments, the diameter is within the range extending from 20 cm to 25 cm.

In certain embodiments, the inner chamber foot part is of cylindrical shape. In certain embodiments, the diameter of the inner chamber foot part is at least 20 cm. In certain more preferred embodiments, the diameter is within the range extending from 20 cm to 50 cm. In yet more preferred embodiments, the diameter is within the range extending from 20 cm to 30 cm.

In certain embodiment, the inner chamber 130 extends downwards to the outside of outer chamber 140. In certain embodiments, the height of the extension is at least 25 cm. In certain more preferred embodiments, the height of the extension is at least 30 cm.

In certain embodiments, the vertical distance between the bottom of the inner chamber 130 and the substrate holder 110 top surface is at least 40 cm. In certain more preferred embodiments, the vertical distance between the bottom of the inner chamber 130 and the substrate holder 110 top surface is at least 50 cm. In certain more preferred embodiments, the vertical distance between the bottom of the inner chamber 130 and the substrate holder 110 top surface is within the range extending from 50 cm to 100 cm.

In certain embodiments, the reaction chamber bowl 133 is a part with rotational symmetry. In certain embodiments, the diameter of the reaction chamber bowl 133 is at least 10 cm larger than that of the substrate holder 110. In certain more preferred embodiments, the diameter of the reaction chamber bowl 133 is at least 14 cm larger than that of the substrate holder 110.

In certain embodiments, the substrate holder 110 is fitted to support a substrate, for example a wafer, with a diameter of at least 200 mm, more preferably 300 mm or larger.

Figure 6:
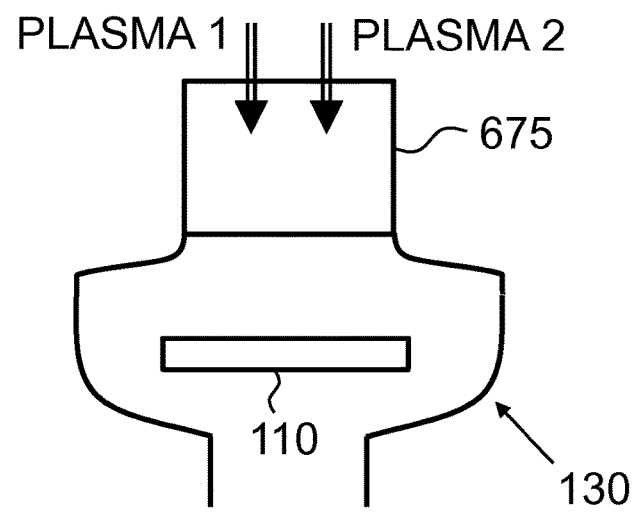
FIG. 6 shows an alternative implementation in accordance with certain embodiments.

FIG. 6 shows an alternative implementation in accordance with certain embodiments. In these embodiments, a plasma system or plasma generator(s) different from the one(s) shown in the preceding FIGS. 1 to 3 is used. Otherwise the structure and operation of the apparatus 100 shown in the preceding with reference to FIGS. 1 to 3 is applied.

The inner chamber 130 is provided with plasma species from the top side via a hollow cathode plasma generator 675. The plasma species flow downwards from the plasma generator 675 towards the substrate support 110 supporting one or more substrates (not shown). In this and other embodiments, the substrate(s) may be horizontally oriented.

In certain embodiments, the inner chamber 130 is provided with a first plasma species PLASMA 1 during a first period, and a second (different) plasma species PLASMA 2, optionally for cleaning, during a subsequent or later period. Both plasma species are generated by the plasma generator 675.

Figure 7:
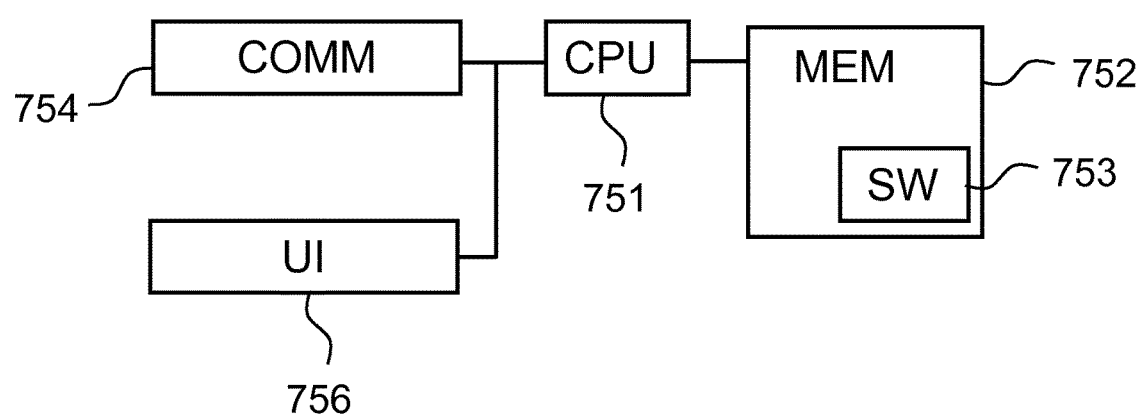
FIG. 7 shows a control system in accordance with certain embodiments.

FIG. 7 shows a block diagram of a control system comprised by the apparatus 100 in accordance with certain example embodiments. The control system 750 comprises at least one processor 751 to control the operation of the apparatus 100 and at least one memory 752 comprising a computer program or software 753. The software 753 includes instructions or a program code to be executed by the at least one processor 751 to control the apparatus 100. The software 753 may typically comprise an operating system and different applications.

The at least one memory 751 may form part of the apparatus 100 or it may comprise an attachable module. The control system 750 further comprises at least one communication unit 754. The communication unit 754 provides for an interface for internal communication of the apparatus 100. In certain embodiments, the control unit 750 uses the communication unit 754 to send instructions or commands to and to receive data from different parts of the apparatus 100, for example, measuring and control devices, valves, pumps, mass flow controllers and other adjustment devices, and heaters.

The control system 750 may further comprise a user interface 756 to co-operate with a user, for example, to receive input such as process parameters from the user. In certain embodiments, the user interface 756 is connected to the at least one processor 751.

As to the operation of the apparatus 100, the control system 750 controls e.g. the process timings of the apparatus. In accordance with certain embodiments, the apparatus 100 is configured, by means of being programmed, for example, to perform a substrate processing sequence or cycle, such as a plasma-enhanced atomic layer deposition sequence or cycle. In accordance with certain embodiments, the apparatus 100 is programmed to perform loading and/or pre-processing and/or post-processing of one or more substrates and/or an etching and/or a cleaning procedure. In accordance with certain embodiments, the control system 750 is configured to adjust the vacuum level in the inner chamber. In certain embodiments, the control system 750 adjusts valve configurations (e.g., in the exhaust line(s)) to adjust the vacuum level in the inner chamber 130. In certain embodiments, the adjustment of valve configurations comprises adjusting the degree of valve opening of the first valve or pendulum valve 143.

In certain embodiments, degassing is done while the substrate is elevated by the lifter pins 17 actuated by actuator 115. In certain embodiments, the substrate is first heated and then risen by the lifter pins 17 for degassing. The degassing may be performed in different temperatures, pressures and/or different flow rates may be used, as compared to those applied during deposition.

In certain embodiments, pressure-modified deposition cycles are performed. In certain embodiments, the pressure modification is achieved by adjusting the degree of valve opening of the valve 143 in the pump line (pump foreline) 144. In certain embodiments, pressure modification is performed during a deposition cycle. Then the pressure within the inner chamber during different phases of a single deposition cycle is different.

In yet other embodiments a source chemical container (such as container 151, 151' and 152) is equipped with a Peltier cooler. In certain embodiments, the Peltier cooler is controlled instead of one voltage level with two fixed (pre-determined) non-zero voltage levels, such as 5 V and 12 V (in addition to an on/off control). Accordingly, the Peltier cooler comprises a control arrangement configured to control the cooler with two fixed non-zero voltage levels. A technical effect obtained is more accurate control in a simple cost-effective manner. The disclosed control of the Peltier cooler is applicable also to source chemical containers in apparatuses different than the ones shown in the preceding description.

Figure 8:
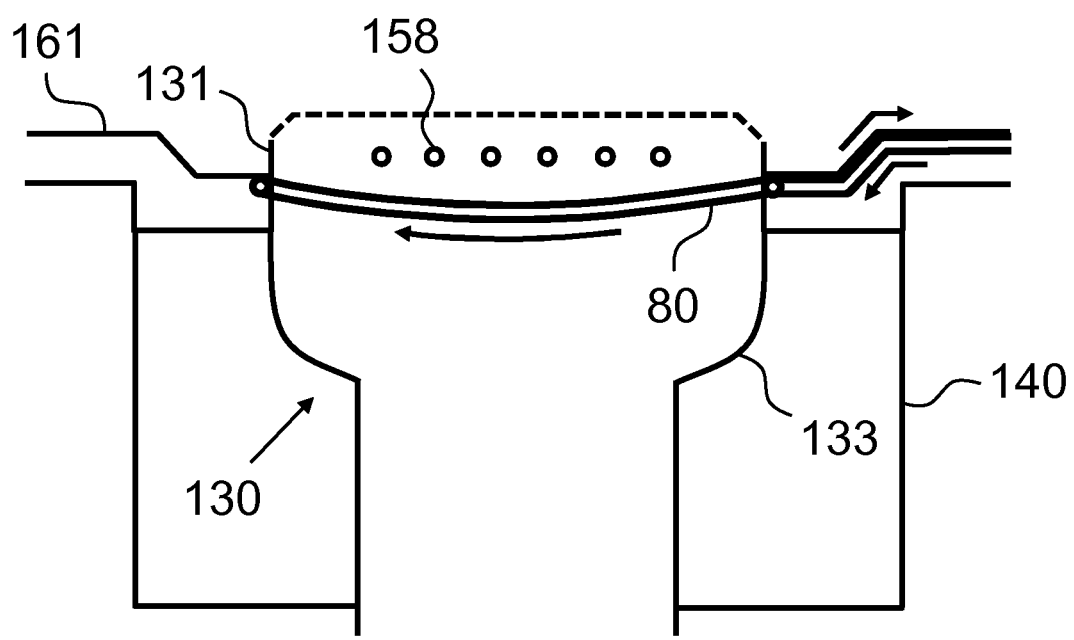
FIG. 8 shows a schematic drawing of a cooling arrangement in accordance with certain embodiments.

FIG. 8 shows a schematic drawing of a cooling arrangement (or cooling system) for a chamber lid in accordance with certain embodiments. A substrate processing apparatus which may be of the type (and having similar structures and functionalities) presented in the preceding comprises the inner chamber (or reaction chamber) 130 and the movable and/or openable lid (or lid system) 161 to the chamber 130. The lid (or lid system) 161 comprises at least a plasma applicator of a plasma generator with the antennas 158 to provide the chamber 130 with plasma species. To cope with heat produced by the applicator, the lid (or lid system) 161 comprises a cooling arrangement. In certain embodiments, the cooling arrangement comprises a channel or channels 80 attached to or embedded into the lid or lid system 161 for flowing a coolant, such as water. The channel(s) may be implemented by pipes attached to the edge(s) of the lid (or lid system) 161. In certain embodiments, such as shown in FIG. 8 the pipes may be positioned into a groove or grooves in the lid (or lid system) 161. The arrows depict coolant flow in the pipes.

Without limiting the scope and interpretation of the patent claims, certain technical effects of one or more of the example embodiments disclosed herein are listed in the following. A technical effect is providing uniform plasma to create a uniform film over the entire substrate area. A further technical effect is good purging conditions together with low deposition rate. A further technical effect is obtaining a short plasma exposition time. A further technical effect is low metal contamination. A further technical effect is low carbon content in deposited films. A further technical effect is in-situ cleaning to provide a long period of utilizing the substrate processing apparatus without a need to open it for a cleaning service. A further technical effect is obtained high level of vacuum by a turbomolecular pump.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means without deviating from the characteristics of the invention.

Furthermore, some of the features of the above-disclosed embodiments of this invention may be used to advantage without the corresponding use of other features. As such, the foregoing description should be considered as merely illustrative of the principles of the present invention, and not in limitation thereof. Hence, the scope of the invention is only restricted by the appended patent claims.

The invention claimed is:

1. A substrate processing apparatus, comprising:
   an inner chamber formed of a partitionless space;
   an outer chamber at least partly surrounding the inner chamber;
   a substrate support to support a substrate in the partitionless space of the inner chamber;
   a lid;
   a plasma generator integrated with the lid; and
   an array of radiation transmitting antennas in a plasma generation volume of the plasma generator, the antennas being in the same partitionless space with the substrate support supporting the substrate.

2. The apparatus of claim 1, wherein the lid is a movable lid or lid system.

3. The substrate processing apparatus of claim 1, wherein the apparatus is further configured to discharge non-plasma gas into the inner chamber at point(s) beneath the plasma generation volume of the plasma generator.

4. The substrate processing apparatus of claim 1, comprising one or more pipes of non-plasma gas passing through the plasma generation volume.

5. The substrate processing apparatus of claim 4, wherein the one or more pipes are made of material which the radiation transmitted by the antennas cannot penetrate.

6. The substrate processing apparatus of claim 1, wherein the antennas are spread horizontally within the plasma generation volume.

7. The substrate processing apparatus of claim 1, wherein the apparatus is configured to ignite plasma within the plasma generation volume by exposing plasma gas to radiation transmitted by the antennas.

8. The substrate processing apparatus of claim 3, comprising:
   a plurality of plasma in-feed line openings in a roof of the plasma generation volume.

9. The substrate processing apparatus of claim 3, wherein the plasma generator comprises:

an expansion volume upstream of opening(s) through which plasma gas enters the plasma generation volume, wherein the plasma gas first flows to the expansion volume for spreading before entering the plasma generation volume through said opening(s).

10. The substrate processing apparatus of claim 1, wherein the plasma generator comprises a microwave plasma generator.

11. The substrate processing apparatus of claim 1, wherein the lid functions as a lid for both the outer chamber and the inner chamber.

12. The substrate processing apparatus of claim 1, wherein a power source of the plasma generator is positioned within the apparatus in a position other than the lid.

13. The substrate processing apparatus of claim 1, wherein the plasma generator comprises a hollow cathode plasma generator.

\* \* \* \* \*